(12) United States Patent
Brunner et al.

(10) Patent No.: US 7,455,939 B2
(45) Date of Patent: Nov. 25, 2008

(54) METHOD OF IMPROVING GRATING TEST PATTERN FOR LITHOGRAPHY MONITORING AND CONTROLLING

(75) Inventors: Timothy A. Brunner, Ridgefield, CT (US); Christopher P. Ausschnitt, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 11/461,217

(22) Filed: Jul. 31, 2006

(65) Prior Publication Data

US 2008/0026298 A1    Jan. 31, 2008

(51) Int. Cl.
*G03F 9/00* (2006.01)
(52) U.S. Cl. .............. 430/5; 430/30; 430/396; 716/19; 257/48
(58) Field of Classification Search ............. 430/5, 430/30, 396; 716/19; 257/48
See application file for complete search history.

(56) References Cited

U.S. PATENT DOCUMENTS

| | | |
|---|---|---|
| 4,166,219 A | 8/1979 | Ausschnitt et al. |
| 4,290,384 A | 9/1981 | Ausschnitt et al. |
| 4,437,760 A | 3/1984 | Ausschnitt |
| 4,538,105 A | 8/1985 | Ausschnitt |
| 4,568,189 A | 2/1986 | Bass et al. |
| 4,848,911 A | 7/1989 | Uchida et al. |
| 4,890,239 A | 12/1989 | Ausschnitt et al. |
| 5,300,786 A | 4/1994 | Brunner et al. |
| 5,343,292 A | 8/1994 | Brueck et al. |
| 5,545,593 A | 8/1996 | Watkins et al. |
| 5,629,772 A | 5/1997 | Ausschnitt |
| 5,712,707 A | 1/1998 | Ausschnitt et al. |
| 5,731,877 A | 3/1998 | Ausschnitt |
| 5,756,242 A | 5/1998 | Koizumi et al. |
| 5,757,507 A | 5/1998 | Ausschnitt et al. |
| 5,776,645 A | 7/1998 | Barr et al. |
| 5,790,254 A | 8/1998 | Ausschnitt |
| 5,805,290 A | 9/1998 | Ausschnitt et al. |
| 5,877,861 A | 3/1999 | Ausschnitt et al. |
| 5,914,784 A | 6/1999 | Ausschnitt et al. |
| 5,928,822 A | 7/1999 | Rhyu |
| 5,949,547 A | 9/1999 | Tseng et al. |
| 5,952,134 A | 9/1999 | Hwang |
| 5,953,128 A | 9/1999 | Ausschnitt et al. |
| 5,965,309 A | 10/1999 | Ausschnitt et al. |
| 5,968,693 A | 10/1999 | Adams |
| 5,976,740 A | 11/1999 | Ausschnitt et al. |
| 5,981,119 A | 11/1999 | Adams |
| 5,985,495 A | 11/1999 | Okumura et al. |
| 6,003,223 A | 12/1999 | Hagen et al. |
| 6,004,706 A | 12/1999 | Ausschnitt et al. |
| 6,020,966 A | 2/2000 | Ausschnitt et al. |
| 6,027,842 A | 2/2000 | Ausschnitt et al. |
| 6,042,976 A | 3/2000 | Chiang et al. |
| 6,061,119 A | 5/2000 | Ota |
| 6,128,089 A | 10/2000 | Ausschnitt et al. |
| 6,130,750 A | 10/2000 | Ausschnitt et al. |
| 6,137,578 A | 10/2000 | Ausschnitt |
| 6,183,919 B1 | 2/2001 | Ausschnitt et al. |
| 6,317,211 B1 | 11/2001 | Ausschnitt et al. |
| 6,335,151 B1 | 1/2002 | Ausschnitt et al. |
| 6,346,979 B1 | 2/2002 | Ausschnitt et al. |
| 6,350,548 B1 | 2/2002 | Leidy et al. |
| 6,417,929 B1 | 7/2002 | Ausschnitt et al. |
| 6,429,667 B1 | 8/2002 | Ausschnitt et al. |
| 6,457,169 B1 | 9/2002 | Ross |
| 6,460,265 B2 | 10/2002 | Pogge et al. |
| 6,612,159 B1 | 9/2003 | Knutrud |
| 6,638,671 B2 | 10/2003 | Ausschnitt et al. |
| 6,766,211 B1 | 7/2004 | Ausschnitt |

(Continued)

FOREIGN PATENT DOCUMENTS

JP    61-168227    7/1986

(Continued)

OTHER PUBLICATIONS

Starikov, Alexander; "Exposure Monitor Structure" Integrated Circuit Metrology, Inspection and Process Control IV, 1990, pp. 315-324.

(Continued)

*Primary Examiner*—Christopher G Young
(74) *Attorney, Agent, or Firm*—DeLio & Peterson LLC; Peter W. Peterson; Wenjie Li

(57) ABSTRACT

A method of making a process monitor grating pattern for use in a lithographic imaging system comprises determining minimum resolvable pitch of a plurality of spaced, adjacent line elements, and selecting a process monitor grating period that is an integer multiple M, greater than 1, of the minimum resolvable pitch. The method then includes designing a process monitor grating pattern having a plurality of adjacent sets of grouped line elements spaced from each other. Each set of grouped line elements is spaced from and parallel to an adjacent set of grouped line elements by the process monitor grating period, such that when the process monitor grating pattern is projected by the lithographic imaging system the line elements in each set are unresolvable from each other and Fourier coefficients of diffracted orders m created by the line elements in the range of $1 < |m| \leq M$ are zero.

10 Claims, 15 Drawing Sheets

U.S. PATENT DOCUMENTS

| | | |
|---|---|---|
| 6,803,995 B2 | 10/2004 | Ausschnitt |
| 6,842,237 B2 | 1/2005 | Ausschnitt et al. |
| 6,869,739 B1 | 3/2005 | Ausschnitt et al. |
| 6,879,400 B2 | 4/2005 | Ausschnitt et al. |
| 6,937,337 B2 | 8/2005 | Ausschnitt et al. |
| 6,975,398 B2 | 12/2005 | Ausschnitt et al. |
| 7,042,551 B2 | 5/2006 | Ausschnitt |
| 2001/0001900 A1 | 5/2001 | Pogge et al. |
| 2002/0097399 A1 | 7/2002 | Ausschnitt et al. |
| 2003/0053057 A1 | 3/2003 | Mishima |

FOREIGN PATENT DOCUMENTS

| | | |
|---|---|---|
| JP | 61-170032 | 7/1986 |
| JP | 2-260441 | 10/1990 |
| JP | 10-213895 | 8/1998 |
| WO | WO02/19415 | 3/2002 |

OTHER PUBLICATIONS

"Method for Measuring Semiconductor Lithographic Tool Focus and Exposure", IBM Technical Disclosure Bulletin, Jul. 1987, 2 pages.

Ausschnitt, Christopher P., Cheng, Shaunee Y.; "Modeling for Profile-Based Process—Window Metrology", SPIE5378-5, Feb. 26, 2004, pp. 1-6.

RESIST PROFILE

RESIST PROFILE

METHOD OF IMPROVING GRATING TEST PATTERN FOR LITHOGRAPHY MONITORING AND CONTROLLING

BACKGROUND OF THE INVENTION

1. Field of the Invention

The present invention relates generally to semiconductor manufacturing and, more particularly, to the monitoring and control of lithographic process conditions used in microelectronics manufacturing.

2. Description of Related Art

The lithographic process allows for a mask or reticle pattern to be transferred via spatially modulated light (the aerial image) to a photoresist (hereinafter, also referred to interchangeably as resist) layer or film on a substrate. Those segments of the absorbed aerial image, whose energy (so-called actinic energy) exceeds a threshold energy of chemical bonds in the photoactive component (PAC) of the photoresist material, create a latent image in the resist. In some resist systems the latent image is formed directly by the PAC; in others (so-called acid catalyzed photoresists), the photo-chemical interaction first generates acids which react with other photoresist components during a post-exposure bake to form the latent image. In either case, the latent image marks the volume of resist material that either is removed during the development process (in the case of positive photoresist) or remains after development (in the case of negative photoresist) to create a three-dimensional pattern in the resist film. In subsequent etch processing, the resulting resist film pattern is used to transfer the patterned openings in the resist to form an etched pattern in the underlying substrate. It is crucial to be able to monitor the fidelity of the patterns formed by both the photolithographic process and etch process, and then to control or adjust those processes to correct any deficiencies. Thus, the manufacturing process includes the use of a variety of metrology tools to measure and monitor the characteristics of the patterns formed on the wafer. The information gathered by these metrology tools may be used to adjust both lithographic and etch processing conditions to ensure that production specifications are met. Control of a lithographic imaging process requires the optimization of exposure dose and focus conditions in lithographic processing of product substrates or wafers.

Lithographic systems consist of imaging tools that expose patterns and processing tools that coat, bake and develop the substrates. The dose setting on the imaging tool determines the average energy in the aerial image. Optimum dose produces energy equal to the resist threshold at the desired locations on the pattern. The focus setting on the imaging tool determines the average spatial modulation in the aerial image. Optimum focus produces the maximum modulation in the image. The settings of many other imaging and processing tool parameters determine the effective dose and defocus (deviation from optimum focus) that form the latent image in the resist film. For advanced imaging tools, such as step-and-scan exposure systems, imaging parameters that determine the effective dose and defocus include the dose setting, slit uniformity, mask-to-wafer scan synchronization, source wavelength, focus setting, across-slit tilt, across-scan tilt, chuck flatness, etc. For advanced processing tools, processing parameters that determine the effective dose and defocus include the coat thickness and uniformity, the post-expose bake time, temperature and uniformity, the develop time, rate and uniformity, wafer flatness, topography, etc. Typically, the different imaging and process parameter sources of variation can be distinguished by the spatial signature of the effective dose and defocus variation they cause.

Variation in both imaging and process parameters cause variations in the spatial distributions of effective dose and defocus in the resist film that, in turn, cause variations in the dimensions of the printed patterns. Because of these variations, patterns developed by lithographic processes must be continually monitored or measured to determine if the dimensions of the patterns are within acceptable range.

Tight process control is a continuing challenge for advanced microlithography processes, such as those used to manufacture state-of-the-art integrated circuits. In normal practice, process control marks printed in the kerf of the chip are measured for compliance to a line width control specification. If the measurement is found to be outside control limits, then corrective actions are taken. Unfortunately, an out-of-spec line width measurement does not clearly point towards a root cause, and this complicates the task of taking the proper corrective action. Many line width deviations are caused by either a focus deviation or an exposure variation, and U.S. Pat. No. 5,965,309 discloses analysis methods which can separately determine these two key quantities.

Other prior art methods have been used to determine variations in exposure dose and focus during lithographic processing. U.S. Pat. No. 5,300,786 discloses a focus monitor test pattern which can accurately determine the sign and magnitude of the defocus value, but requires the use of a phase shifting mask, which may not be compatible with most products. An exposure monitor intended to be particularly sensitive to exposure dose via a mask edge, and which would transition from dark to bright by a series of gradually changing sub-resolution lines, was disclosed in A. Starikov, SPIE Vol. 1261, pp. 3 15-324 (1990). Such Starikov exposure monitor patterns are extremely difficult to build because of their very small dimensions, and are not periodic, and consequently cannot be measured using scatterometry.

U.S. Pat. No. 7,042,551 discloses use of isolated gratings where the size of the individual elements is small with respect to the pitch of the grating. The process window is small compared to the features on the chip, and there is a limit to how isolated one can make these gratings. Other methods are described in U.S. Pat. Nos. 5,953,128; 5,976,740; 6,004,706; 6,027,842 and 6,128,089.

SUMMARY OF THE INVENTION

Bearing in mind the problems and deficiencies of the prior art, it is therefore an object of the present invention to provide a lithographic monitoring and control system that has high sensitivity to dose and focus.

It is another object of the present invention to provide a lithographic monitoring and control system that is readily fabricated with good uniformity across the mask, i.e., with maximized feature size of the grating elements (with robust elements that are less likely to collapse on fabrication), and no need for altPSM elements.

A further object of the invention is to provide a lithographic monitoring and control system that has ease of measurement using either low resolution techniques, such as optical scatterometry or diffractometry, or high resolution techniques, such as SEM or AFM.

Still other objects and advantages of the invention will in part be obvious and will in part be apparent from the specification.

The above and other objects, which will be apparent to those skilled in the art, are achieved in the present invention which is directed to a method of making a process monitor grating pattern for use in a lithographic imaging system comprising determining minimum resolvable pitch of a plurality of spaced, adjacent line elements, wherein each of the line elements are separately resolvable when projected by the lithographic imaging system, and selecting a process monitor grating period that is an integer multiple M, greater than 1, of the minimum resolvable pitch. The method then includes designing a process monitor grating pattern having a plurality of adjacent sets of grouped line elements spaced from each other. Each set of grouped line elements is spaced from and parallel to an adjacent set of grouped line elements by the process monitor grating period, such that when the process monitor grating pattern is projected by the lithographic imaging system the line elements in each set are unresolvable from each other and Fourier coefficients of diffracted orders m created by the line elements in the range of $1<|m|\leq M$ are zero.

Preferably the grouped line elements comprise a center line and adjacent lines spaced on each side of the center line, and the center line has a width greater than the widths of the adjacent lines. The number of line elements in each set of grouped line elements in a process monitor grating pattern is preferably the smallest odd integer greater than or equal to M.

The process monitor grating period $P_{PMG}$ may be determined by the formula:

$$P_{PMG} < [(M+1)/(1+\sigma_{max})]\lambda/NA$$

wherein $\lambda$ is the exposure wavelength, NA is the numerical aperture value, and $\sigma_{max}$ is the maximum illumination coherence of the lithographic imaging system. During designing of the process monitor grating pattern, a solution set of the Fourier coefficients is preferably selected to be compatible with the fabrication capability of the mask to be made and the wafer process, and the widths of the line elements and spaces in the process monitor grating pattern are corrected for electromagnetic field (EMF) effects in the mask to be used in the lithographic imaging system The method may also use sets of grouped line elements spaced apart in two dimensions, with the process monitor grating period of the grouped line elements spaced apart in one dimension being the same or different from the process monitor grating period of the grouped line elements spaced apart in the other dimension.

The method may further include depositing the process monitor grating on a mask to be used in the lithographic imaging system.

In another aspect, the present invention is directed to a lithographic imaging system mask comprising a substrate having a process monitor grating pattern thereon. The process monitor grating pattern comprises a plurality of adjacent sets of grouped line elements spaced from each other. Each set of grouped line elements is spaced from and parallel to an adjacent set of grouped line elements by a process monitor grating period. The process monitor grating period is an integer multiple M, greater than 1, of the minimum resolvable pitch of spaced, adjacent line elements that are separately resolvable when projected by the lithographic imaging system. When the process monitor grating pattern is projected by the lithographic imaging system, the line elements in each set are unresolvable from each other and Fourier coefficients of diffracted orders m created by the line elements in the range of $1<|m|\leq M$ are zero.

Preferably, the grouped line elements comprise a center line and adjacent lines spaced on each side of the center line, and wherein the center line has a width greater than the widths of the adjacent lines The mask may include sets of grouped line elements spaced apart in two dimensions, wherein the process monitor grating period of the grouped line elements spaced apart in one dimension are the same or different from the process monitor grating period of the grouped line elements spaced apart in the other dimension.

In a further aspect, the present invention is directed to a method of monitoring a lithographic imaging system comprising exposing and printing onto a resist film layer on a substrate, at different exposure conditions, an image of a process monitor grating pattern. The process monitor grating pattern is made up of a plurality of adjacent sets of grouped line elements spaced from each other, with each set of grouped line elements being spaced from and parallel to an adjacent set of grouped line elements by a process monitor grating period. The process monitor grating period is an integer multiple M, greater than 1, of the minimum resolvable pitch of spaced, adjacent line elements that are separately resolvable when projected by the lithographic imaging system. When the process monitor grating pattern is projected by the lithographic imaging system the line elements in each set are unresolvable from each other and Fourier coefficients of diffracted orders m created by the line elements in the range of $1<|m|\leq M$ are zero. The method then includes measuring a dimension of the exposed and printed image on the resist film layer at the different exposure conditions of the lithographic imaging system, and comparing the measured dimensions of the exposed image at the different exposure conditions. After determining any differences in the measured dimensions, the method includes using the comparison of the measured dimensions of the exposed image to determine desired exposure condition of the lithographic imaging system.

The measured dimensions may comprise width of an image of at least one set of grouped line elements of the process monitor grating pattern exposed and printed onto the resist film layer, or sidewall angle of an image of at least one set of grouped line elements of the process monitor grating pattern exposed and printed onto the resist film layer. The measured exposure condition may comprises exposure dose and/or focus of the image by the lithographic imaging system.

In employing such method, the process monitor grating pattern may comprise sets of grouped line elements spaced apart in x- and y-directions, with the process monitor grating period of the grouped line elements spaced apart in one dimension being the same or different from the process monitor grating period of the grouped line elements spaced apart in the other dimension. In such case, the method includes measuring dimensions of the exposed and printed images in both x- and y-directions, comparing the measured dimensions in both x- and y-directions, and using the comparison of the measured dimensions to determine desired exposure conditions in both x- and y-directions. The measured dimensions in the x- and y-directions are used to monitor development of exposed images of contacts in the resist film layer, for example.

In yet another aspect, the present invention is directed to a method of monitoring a lithographic imaging system comprising exposing and printing onto a resist film layer on a substrate, at different regions of the resist film layer, a process monitor grating pattern of the type described above. The method then includes measuring a dimension of the exposed and printed image on the resist film layer at the different regions, comparing the measured dimensions of the exposed image at the different regions and determining any differences in dimension, and using the comparison of the measured dimensions of the exposed image to monitor exposure conditions at the different regions of the resist film layer.

The method may further include exposing and printing onto a resist film layer circuit patterns of different pattern density on the different regions of the resist film layer. The comparison of the measured dimensions of the exposed image may be used to determine lithographic conditions in different density environments on the circuit pattern. The measured dimensions comprise width of an image of at least one set of grouped line elements of the process monitor grating pattern exposed and printed onto the resist film layer, or sidewall angle of an image of at least one set of grouped line elements of the process monitor grating pattern exposed and developed onto the resist film layer. The measured exposure condition may comprise exposure dose and/or focus of the image by the lithographic imaging system.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-15 of the drawings in which like numerals refer to like features of the invention.

The present invention introduces a highly optimized, practical exposure monitor test patterns which are particularly sensitive to dose and focus. The use of such patterns will help to achieve tighter process control, and to pinpoint exposure variations. A preferred embodiment of this invention is a test pattern suitable for measurement with modern scatterometry test methods. The test patterns of the present invention employ gratings where certain diffraction orders are suppressed. The design approach leads to structures which are tunable to dose and focus changes.

Figure 1:
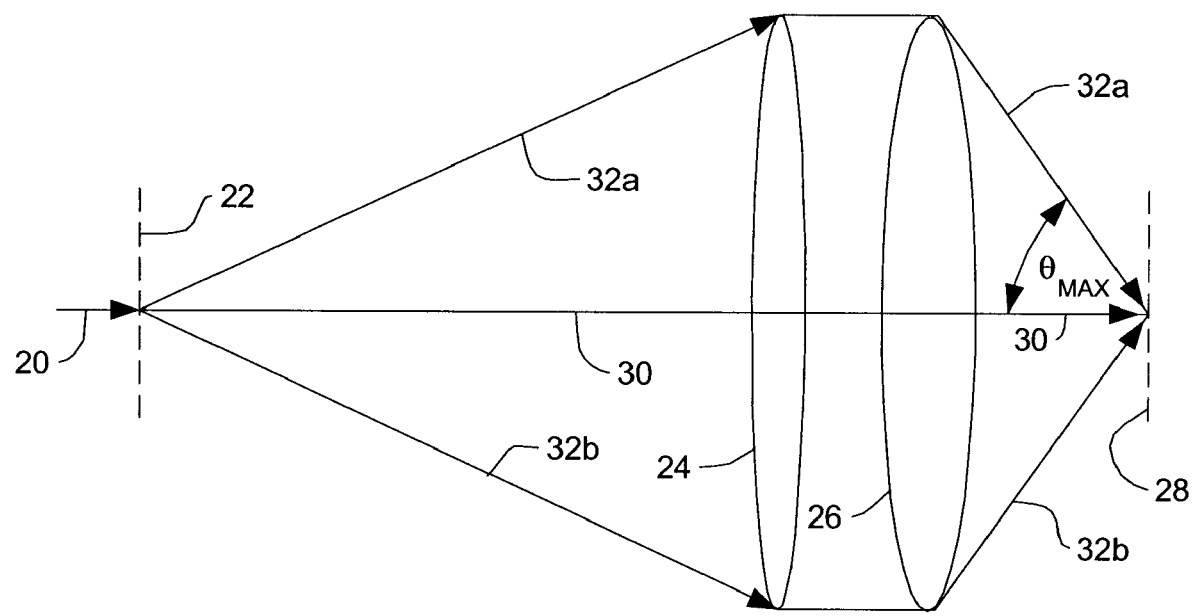
FIG. 1 is a side elevational view of a lithographic system for projection of an image from a mask or reticle onto a wafer.

In a typical lithographic projection system depicted in FIG. 1, a light source 20 projects light rays through a pattern on a mask or reticle 22. Other radiation sources may be used to project other energy rays in place of the light rays depicted here. Lenses 24, 26 are oriented along the centerline or optical axis 30. The projected light rays of maximum angle are shown as 32a, 32b, and define the outer limits of the image which is ultimately reduced and projected onto wafer 28 by lens 26. The designated angle $\theta_{max}$ is the angle of the most oblique ray projected onto the wafer. The numerical aperture NA is given by the formula:

$$NA = n \cdot \sin(\theta_{max})$$

where n is the immersion index (typically air with n≈1). This system assumes a four (4) times reduction in the size of the image on the wafer, compared to the actual size on the reticle, and the image is a simple grating with $k_1$=0.5 (coherent limit).

Figure 2:
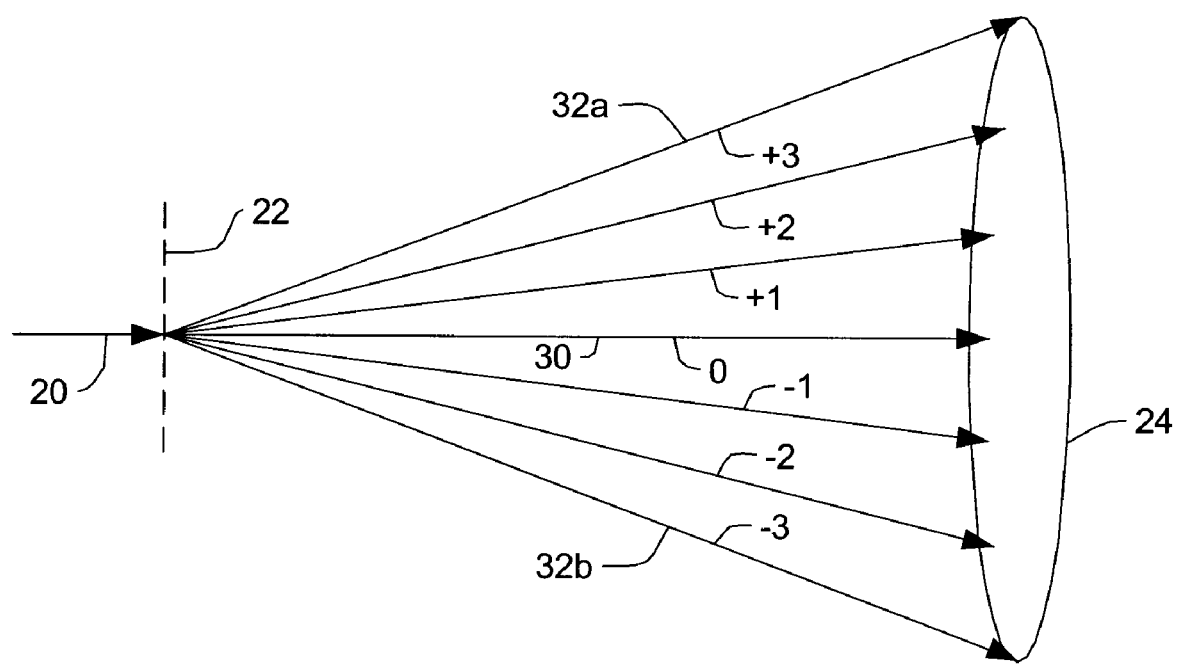
FIG. 2 is a close up of the projection of light through the reticle of FIG. 1, showing the multiple diffraction orders that are produced.
Figure 3:
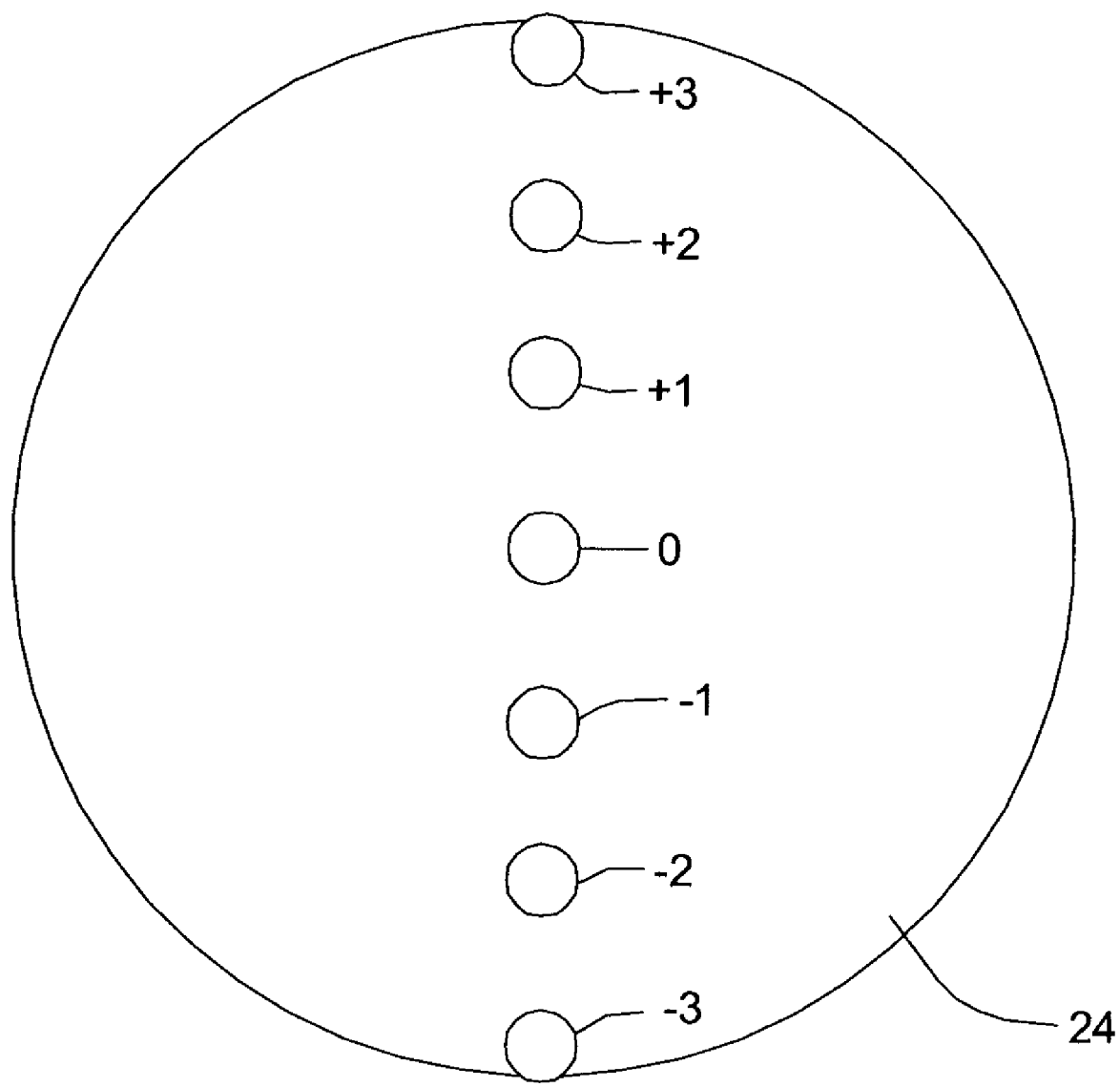
FIG. 3 shows a front elevational view, along the optical axis of FIG. 2, showing the different diffraction orders projected by the reticle.

As shown in FIGS. 2 and 3, if a grating is used on the reticle, with the grating consisting of alternating lines and spaces of pitch P, multiple orders of diffraction of the light may be generated and produce some image modulation. This is shown by the formula:

$$\sin(\theta_m) = m\lambda/P$$

where m is the order number of the diffractive light, and $\theta_m$ is the angle of the diffractive order number. As shown, there are seven (7) diffractive orders m within the pupil:

−3, −2, −1, 0, +1, +2, +3

The maximum diffractive order M is therefore +3 and −3. Any orders diffracted outside the pupil are irrelevant to imaging. Fourier optics teaches that higher orders carry higher spatial frequency information.

In the preferred embodiment of the invention used in optical lithography, the process monitor grating target is constructed so that the image of the grating projected onto the wafer contains only orders where |m|≦1. By eliminating orders of |m|≧1 and the higher spatial frequencies associated therewith, it has been determined that there is a reduction in the image slope and thus the printed pattern is much more sensitive to exposure variation.

The preferred method to design the process monitor grating target of the present invention is to initially determine the diffraction limit of the imaging system being used. This is done by first considering a conventional grating pattern comprising a plurality of parallel lines spaced from each, wherein the widths of the lines and spaces are equal, and the pitch P of the pattern is the sum of one line width and one space width. The minimum resolvable pitch is then determined, i.e., the smallest line and space width such that each of the lines is resolvable from another when projected and developed onto a resist layer. In an optical lithographic imaging system, the minimum resolvable pitch $P_{min}$ of a conventional grating pattern is given by the formula:

$$P_{min} = \lambda / [NA(1+\sigma_{max})]$$

where $\lambda$ is the exposure wavelength, NA is the numerical aperture value, and $\sigma_{max}$ is the maximum illumination coherence of the system.

Instead of utilizing conventional spaced line elements, wherein each line element is separately resolvable, the present invention utilizes process monitor grating (PMG) test patterns, wherein each PMG test pattern comprises a set of a plurality of grouped line elements. Each PMG test pattern is spaced from an adjacent pattern, and the grating period $P_{PMG}$ is the sum of the total width of one group of line elements in the pattern plus the distance between adjacent PMG test patterns. The grating period $P_{PMG}$ is selected to equal $M \cdot P_{min}$, where M>1, such that the highest grating order M that can be imaged by the lens is given by the formula:

$$M+1 > P_{PMG}(1+\sigma_{max})NA/\lambda$$

The method then includes designing a set of grating line elements within each period of the grating target that makes the Fourier coefficients equal zero within the range of 1<|m|≦M. The size of such grating line elements should be compatible with the particular pattern fabrication process being used, so that all diffracted orders within this range are identically zero.

To select a process monitor grating pitch $P_{PMG}$ with a maximum diffractive order M within the pupil of the lithographic system, the previous formula is rewritten as:

$$P_{PMG} < [(M+1)/(1+\sigma_{max})]\lambda/NA$$

If the 4$^{th}$ and higher diffractive orders are to be outside the pupil, M is selected to be 3. Using as an example a lithographic system where the light wavelength $\lambda$ is 193 nm, the numerical aperture is 0.75, and the $\sigma$ maximum illumination coherence $\sigma_{max}$ is 1, a process monitor grating pitch $P_{PMG}$ of 500 nm meets the criteria of the equation to exclude the 4$^{th}$ and higher orders. It should be noted that by selecting $\sigma_{max}=1$, the process monitor grating design will work for all illuminations.

Figure 4:
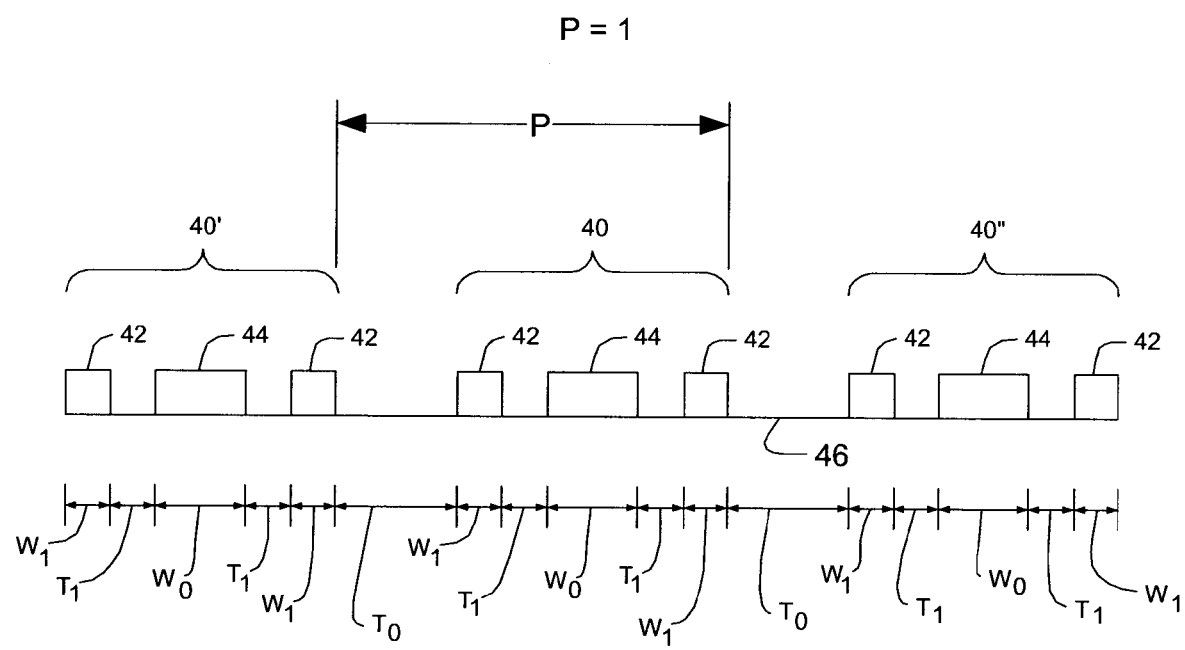
FIG. 4 is a side elevational view showing the sets of line elements that make up the adjacent process monitor grating patterns on the reticle of the preferred embodiment of the present invention.
Figure 5:
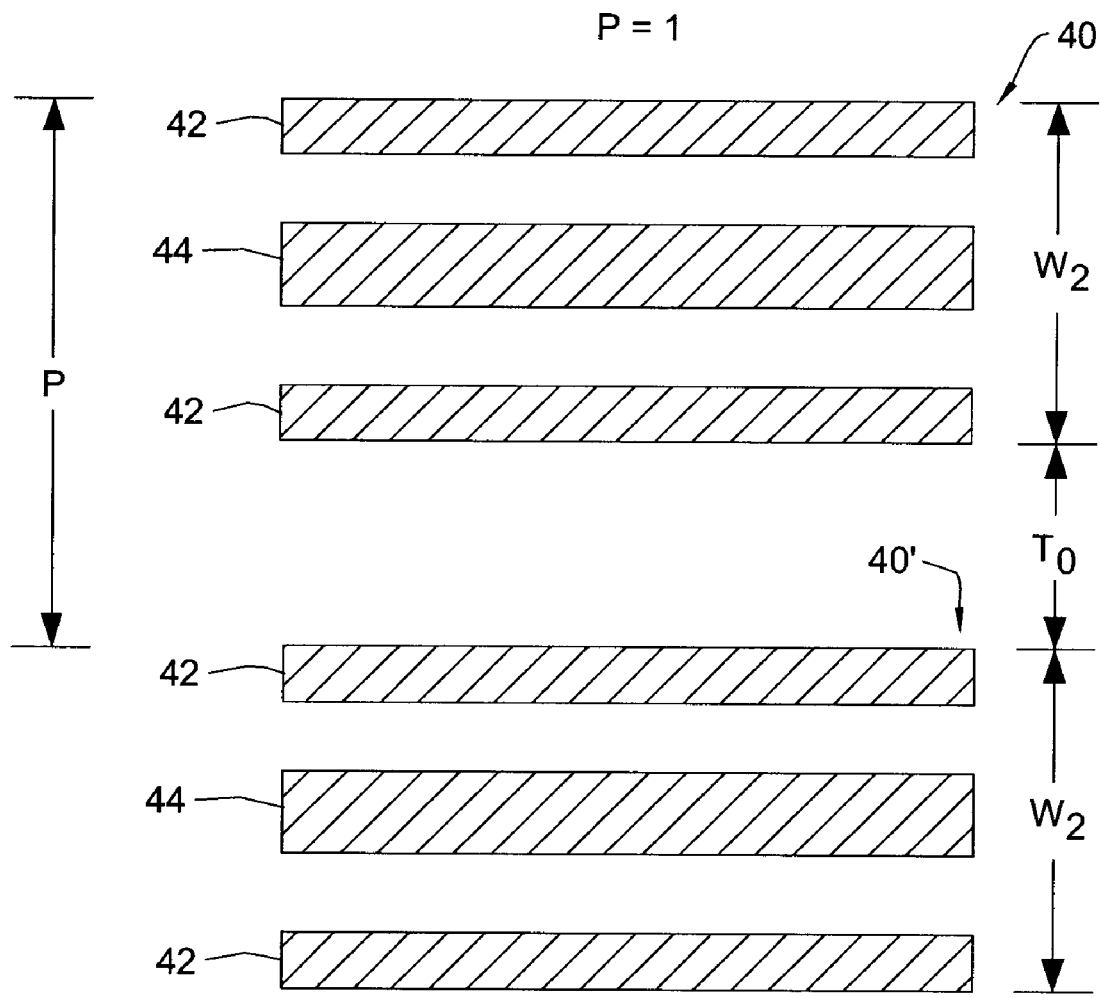
FIG. 5 is a top plan view showing the portion of the line elements in two adjacent process monitor grating patterns of FIG. 4.

In one preferred embodiment of the present invention depicted in FIGS. 4 and 5, process monitor grating test patterns 40, 40' and 40" are shown deposited on a clear mask substrate 46. Each process monitor grating pattern 40, 40', 40" is shown having three (3) line elements arranged symmetrically within the group. The width of each element can be expressed as a unitless parameter normalized to the period $P_{PMG}$. Central line 44 in each grating target pattern preferably has a greater width $w_0$ than the width $w_1$ of associated lines 42 on either side thereof, and is spaced by a distance $t_1$ from each line 42. While the spaces between central line 44 and adjacent lines 42 transmit light projected therethrough, the widths of the spaces $t_1$ and adjacent lines $w_1$ are selected so that the smaller associated lines 42 are not separately resolved from central line 44 when the process monitor grating pattern is projected by the lithographic system onto a resist layer to expose the resist. The normalized pitch p=1 of the process monitor grating patterns is the sum of the normalized widths of the set of grouped line elements and spaces of one pattern, $w_1+t_1+w_0+t_1+w_1$ ($w_2$, FIG. 5), and the normalized width to of the spacing between a one set of grouped line patterns and another.

As used herein, upper case letters, e.g. $W_1$, indicate actual physical widths, and lower case letters indicate relative widths, e.g. $w_1=W_1/P$. The pitch $P_{PMG}$ of the process monitor grating patterns is the sum of the total width of the set of grouped line elements and spaces of one pattern, $P_{PMG}=W_0+2T_1+2W_1+T_0$, which is same as $1=w_0+2t_1+2w_1+t_0$.

The number of line elements in a process monitor grating pattern is preferably selected to be the smallest odd integer greater than or equal to the maximum diffractive order to be included in the pupil. In the above example for M=3, the number of line elements is 3. If M is 4 or 5, the number of line elements used is 5 and if M is 6 or 7, the number of line elements used is 7, and so on.

To eliminate diffracted orders m=2 and m=3 in the aforementioned example, one must determine the $w_0$, $w_1$, to and $t_1$ normalized dimensions such that the Fourier coefficients of the diffracted orders are identically zero. The diffracted orders are calculated as simple Fourier coefficients of mask using thin mask approximation (TMA), by the following formulas:

$$A_{PMG}(x) = a_0 + (2/\pi)[a_1 \cos(2\pi x) + (a_2/2)\cos(4\pi x) + (a_3/3)\cos(6\pi x)]$$

$$a_0 = t_0 + 2t_1$$

$$a_1 = \sin(\pi t_0) + 2 \sin(\pi t_1)\cos(2\pi x_1)$$

$$a_2 = \sin(2\pi t_0) + 2 \sin(2\pi t_1)\cos(4\pi x_1)$$

$$a_3 = \sin(3\pi t_0) + 2 \sin(3\pi t_1)\cos(6\pi x_1)$$

$$x_1 = ((t_0+t_1)/2) + w_1$$

where $A_{PMG}$ is the image amplitude profile, x is a relative spatial coordinate ($x = X/P_{PMG}$), $a_0$ is the zero order amplitude or coefficient, $a_1$ is the first order amplitude or coefficient, $a_2$ is the second order amplitude or coefficient, $a_3$ is the third order amplitude or coefficient and $x_1$ is the intermediate center-to-center distance between the transmitting regions of the pattern.

Figure 6:
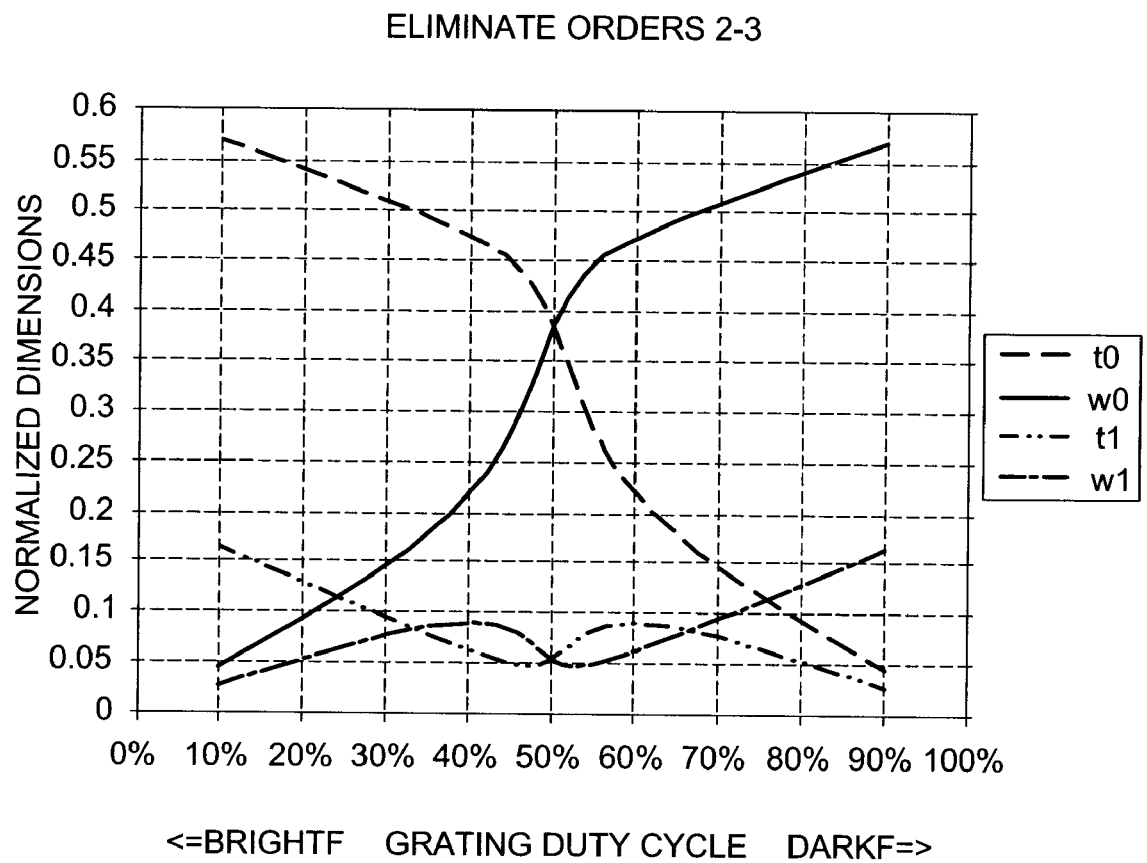
FIG. 6 plots the dimensions (normalized to the pitch) of the family of solutions that suppress the second and third diffraction orders.

In solving the above equations and determining the set of ($W = w P_{PMG}$, $T = t P_{PMG}$) line element dimensions so that $a_2$ and $a_3$ equal zero, a plurality of solution sets are found for the process monitor grating line widths and spacings, $w_0$, $w_1$, $t_0$ and $t_1$. The family of allowed solutions is shown in FIG. 6 as a function of the pattern duty cycle, $d = w_0 + 2w_1$. A solution set is selected that is compatible with the fabrication capability of the mask to be made and the wafer process. This is done by choosing a duty cycle compatible with the pattern density of the mask whose corresponding feature sizes are well within the mask making capability. The particular duty cycle chosen for the example below is ~30%. One convenient method is to use numerical minimization methods, such as Excel Solver, to minimize the desired orders by using the widths and spacings as free parameters.

The previous analysis assumed Thin Mask Approximation (TMA). It is known that Electro Magnetic Field (EMF) effects caused by the detailed structure of the mask will cause the absorber lines to print as though they were biased by a small amount which may be called the EMF bias. Subsequently, the line element dimensions are corrected for EMF effects by comparing the dimensions determined using the TMA to those determined using exact EMF solutions for the actual mask absorber thickness. EMF bias can be determined in a straight-forward way using standard lithography simulation software such as the TEMPEST program, developed by UC Berkeley. For a typical attenuated PSM mask for 193 nm lithography, this EMF bias is approximately +4.5 nm at the wafer, or +18 nm at the 4× reticle.

The computed and corrected element dimensions are shown below in Table 1:

TABLE 1

| Element | Computed Value | EMF Corrected Value |
|---------|----------------|---------------------|
| $T_0$   | 255.6 nm       | 260 nm              |
| $T_1$   | 47.46 nm       | 52 nm               |
| $W_0$   | 72.54 nm       | 68 nm               |
| $W_1$   | 38.46 nm       | 34 nm               |

In the process monitor grating design shown in FIGS. 4 and 5, process monitor grating test lines 44 are of width 68 nm, and lines 42 are of each of width 34 nm and spaced on either side of line 44 by a distance of 52 nm. Each process monitor grating test pattern 40, 40', 40" is spaced form an adjacent pattern by 260 nm. Thus the pitch P of the target pattern shown is the sum of the overall width of the process monitor grating test pattern, 34 nm+52 nm+68 nm+52 nm+34 nm, plus the width of the spacing to the next target pattern group, 260 nm, to give a total pitch P of 500 nm.

By choosing a pitch of 500 nm, there are eliminated the second and third diffraction orders of the grating. In summary, all fourth and higher orders are eliminated by falling outside the pupil. By choosing the specially designed grating with $w_0, w_1, t_0, t_1$ there are eliminated $\pm 2^{nd}$ and $\pm 3^{rd}$ orders.

While the process monitor grating pattern described and shown herein has the ability to have higher resolution, by including more orders within pupil, it intentionally suppresses all orders greater than 1 and is therefore imaged with relatively poorer resolution. As such, the process monitor grating pattern of the present invention has a relatively large structure, and consequently a large dynamic range, and is robust enough to avoid the structural problems of smaller target patterns and systems.

By comparison, conventional prior art gratings would have solid lines, and be of either the isolated or nested type. Nested gratings have a duty cycle approximately equal to 50%. Isolated gratings have a duty cycle >>or <<50%. Taking dimension $w_0$ as the width of the solid line element, such conventional grating dimensions would compare to the process monitor grating pattern of the present invention as shown in Table 2 below:

TABLE 2

| Element | Conventional Nested | Conventional Isolated | Present Invention |
|---------|---------------------|-----------------------|-------------------|
| $T_0$   | 130 nm              | 380 nm                | 260 nm            |
| $T_1$   | 0                   | 0                     | 52 nm             |
| $W_0$   | 120 nm              | 120 nm                | 68 nm             |
| $W_1$   | 0                   | 0                     | 34 nm             |
| P       | 250 nm              | 500 nm                | 500 nm            |

Figure 7:
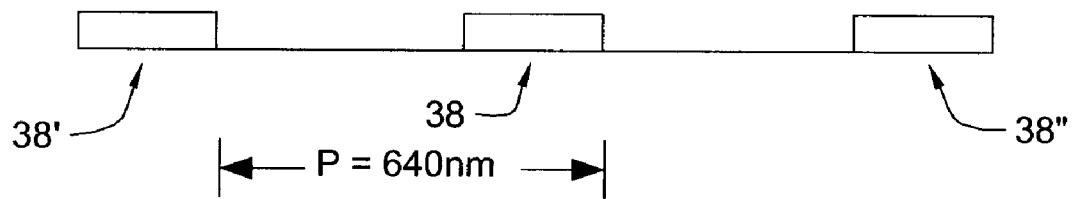
FIG. 7 is a schematic side view showing a projection of light through a conventional solid target pattern on the reticle of a lithographic imaging system and the resulting profile of the image along the thickness of a resist film layer on a wafer substrate.
Figure 7:
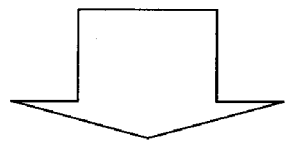
Figure 7:
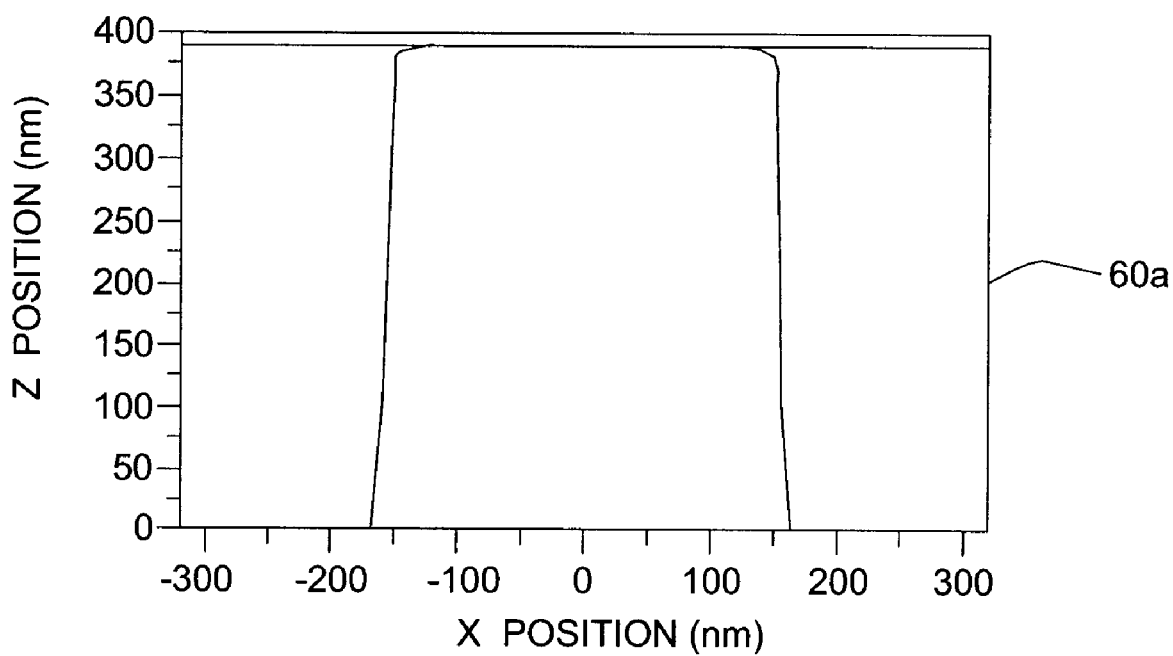
Figure 8:
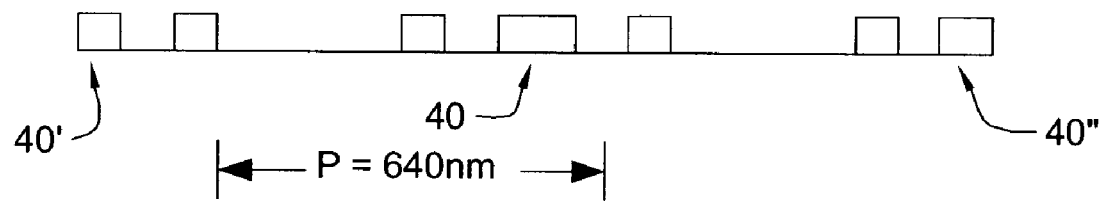
FIG. 8 is a schematic side view, similar to that of FIG. 7, but showing a projection of light through line elements of a process monitor grating pattern on a reticle, made in accordance with the present invention.
Figure 8:
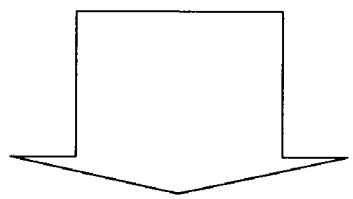
Figure 8:
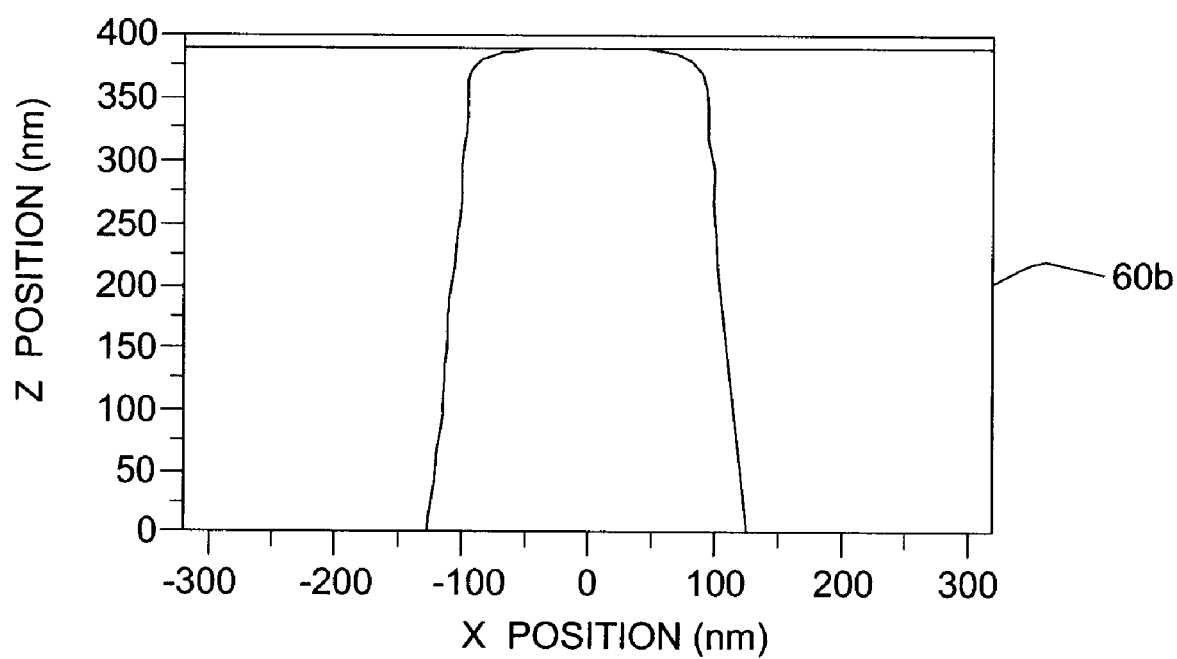

FIGS. 7 and 8 depict the profile of the projected image of a conventional prior art pattern and process monitor grating pattern of the present invention, respectively, through the thickness of a resist layers 60a, 60b, respectively. As shown in FIG. 7, solid pattern lines 38, 38', 38" of width 320 nm are spaced apart from each other by a distance of 320 nm so that the pitch P is 640 nm. Upon projection of a light in a system similar to that of FIG. 1, the image of pattern line 38 is projected, exposed and developed onto resist layer 60a of a thickness 375 nm in the z-direction. The profile of the walls of the resist are shown in the graphical depiction as a function of the x position about the centerline of solid pattern line 38. FIG. 8 shows a similar projection as that of FIG. 7, except that there is substituted the process monitor grating patterns, 40, 40', 40" designed in accordance with the present invention. The line elements and spacing in process monitor grating patterns, 40, 40', 40" are $W_0$=93 nm, $W_1$=49 nm and $T_1$=61 nm, and the spacing between adjacent grating patterns is $T_0$=327 nm, for a total pitch $P_{PMG}$=640 nm. The individual line elements in each of the process monitor grating patterns are unresolved, and the resulting resist profile in resist layer 60b shows the resist profile of process monitor grating pattern 40 in the z-direction as a function of the x position about the centerline of the pattern.

Figure 9:
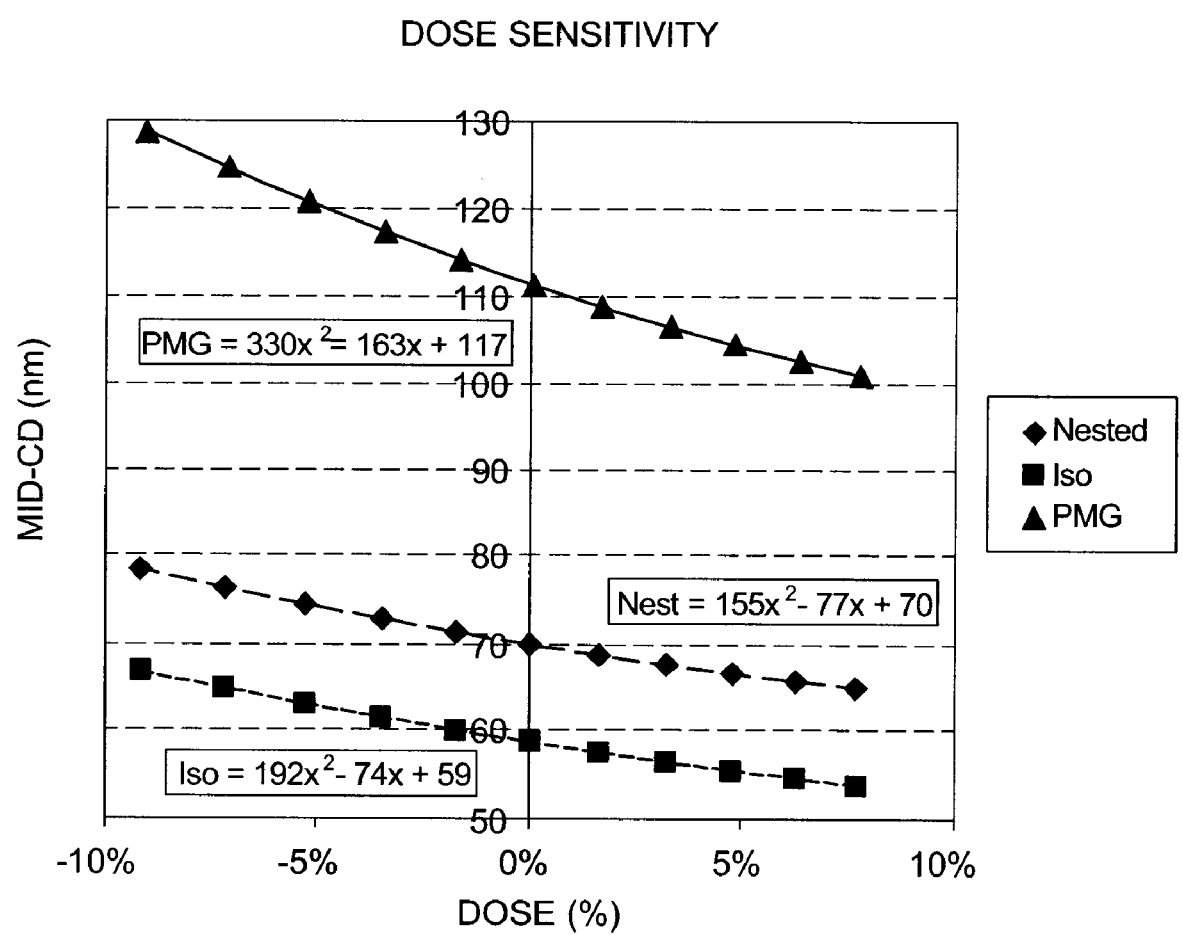
FIG. 9 is a graphical depiction comparing the dose sensitivity of a measurement of a critical dimension (CD) width at the mid-point of the profile z-position (height) on an image printed through a resist film layer of a) a conventional prior art nested solid line grating, b) a conventional prior art isolated solid line grating and c) the process monitor grating pattern of the present invention.
Figure 10:
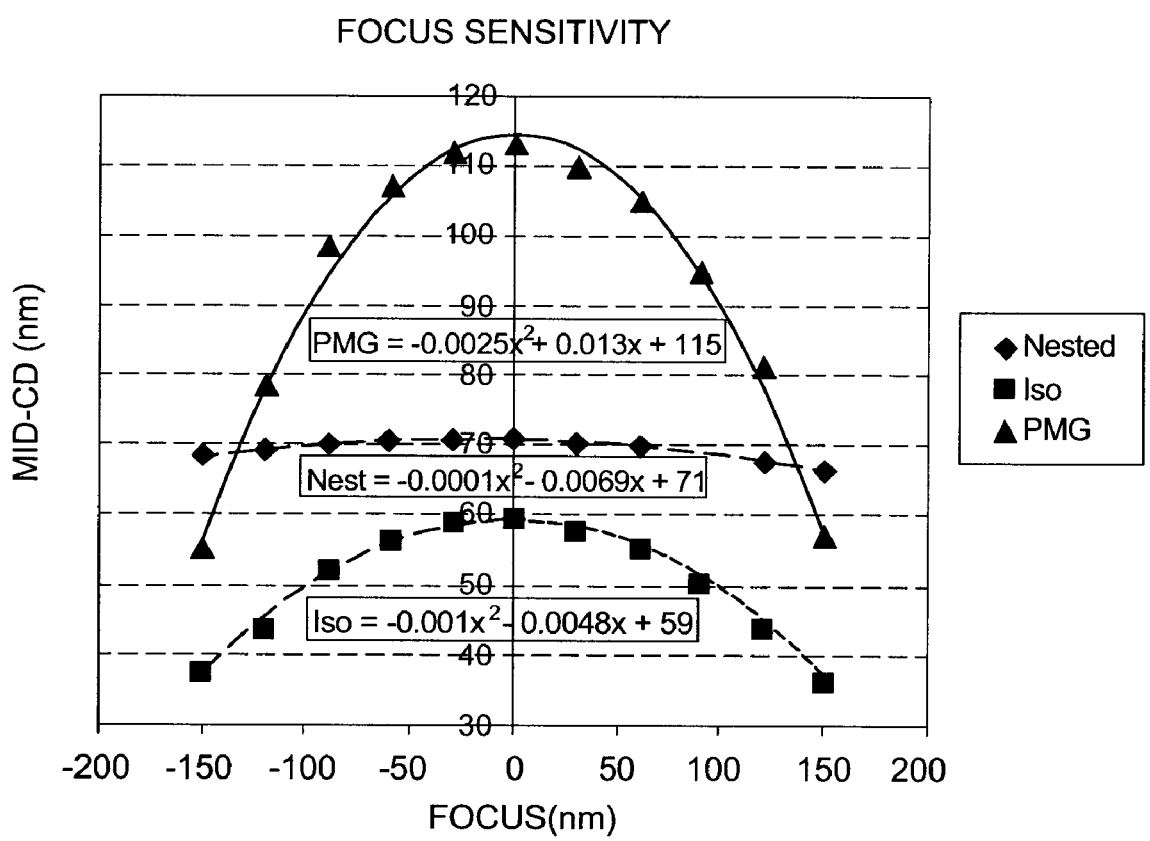
FIG. 10 is a graphical representation similar to that of FIG. 9, except comparing focus sensitivity.

When measuring the critical dimension (CD) width of a test pattern, the process monitor grating pattern of the present invention shows improved dose and focus sensitivity over the conventional solid line isolated and nested gratings of the prior art. FIG. 9 is a is a comparison of dose sensitivity of a measurement of a critical dimension (CD) width in nanometers at the mid-point of the profile z-position (height) on an image printed through a resist film layer of a conventional prior art nested and isolated solid line grating compared to a process monitor grating pattern of the present invention. FIG. 10 compares the same prior art and present invention grating patterns for focus sensitivity. The present invention process monitor grating pattern displays a higher CD at nominal dose and focus compared to prior art solid line gratings, which indicates that it is more robust to process, and improves CD measurement capability. At the same time, the present invention process monitor grating pattern has greater CD sensitivity through both dose and focus compared to prior art solid line gratings, which indicates an improved dose and focus deconvolution capability for monitoring of the lithographic system.

Figure 11:
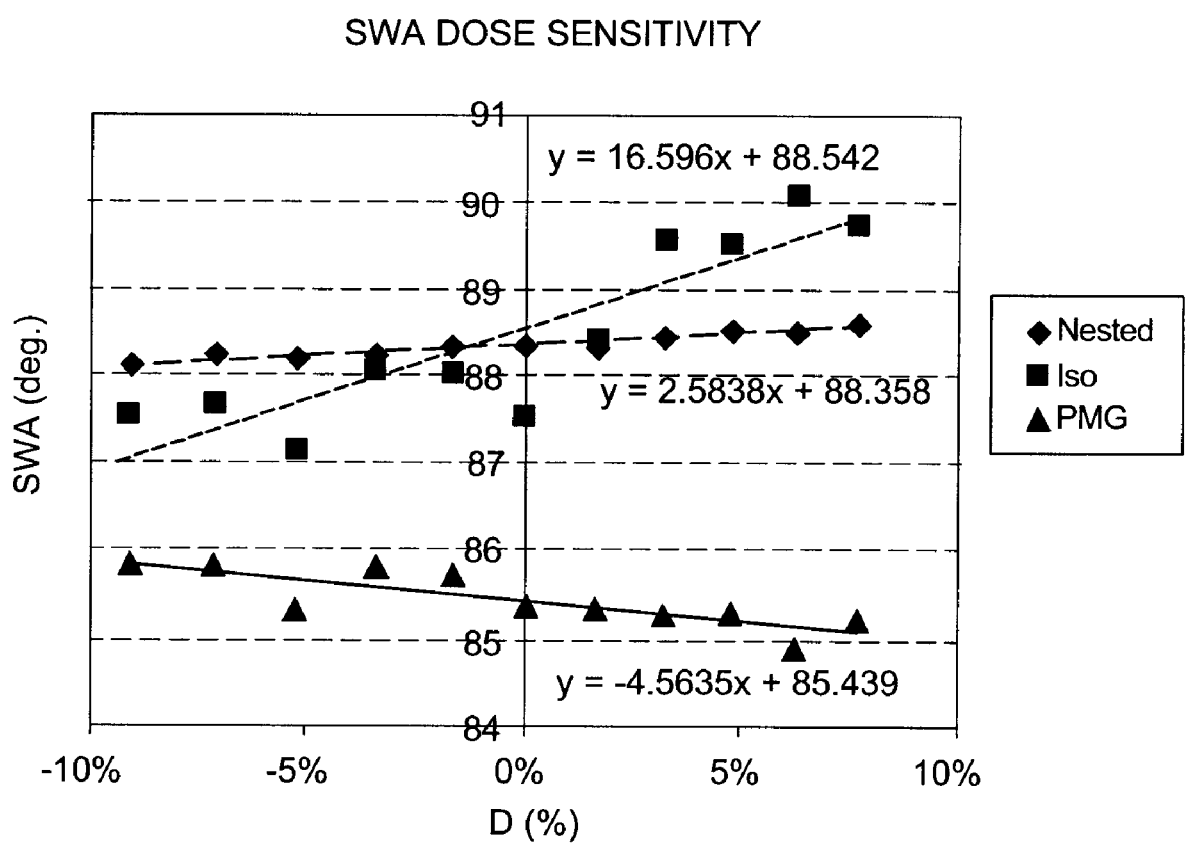
FIG. 11 is a graphical depiction comparing the dose sensitivity of the measured sidewall angle along an elevational cross section of an image printed through a resist film layer of a) a conventional prior art nested solid line grating, b) a conventional prior art isolated solid line grating and c) the process monitor grating pattern of the present invention.
Figure 12:
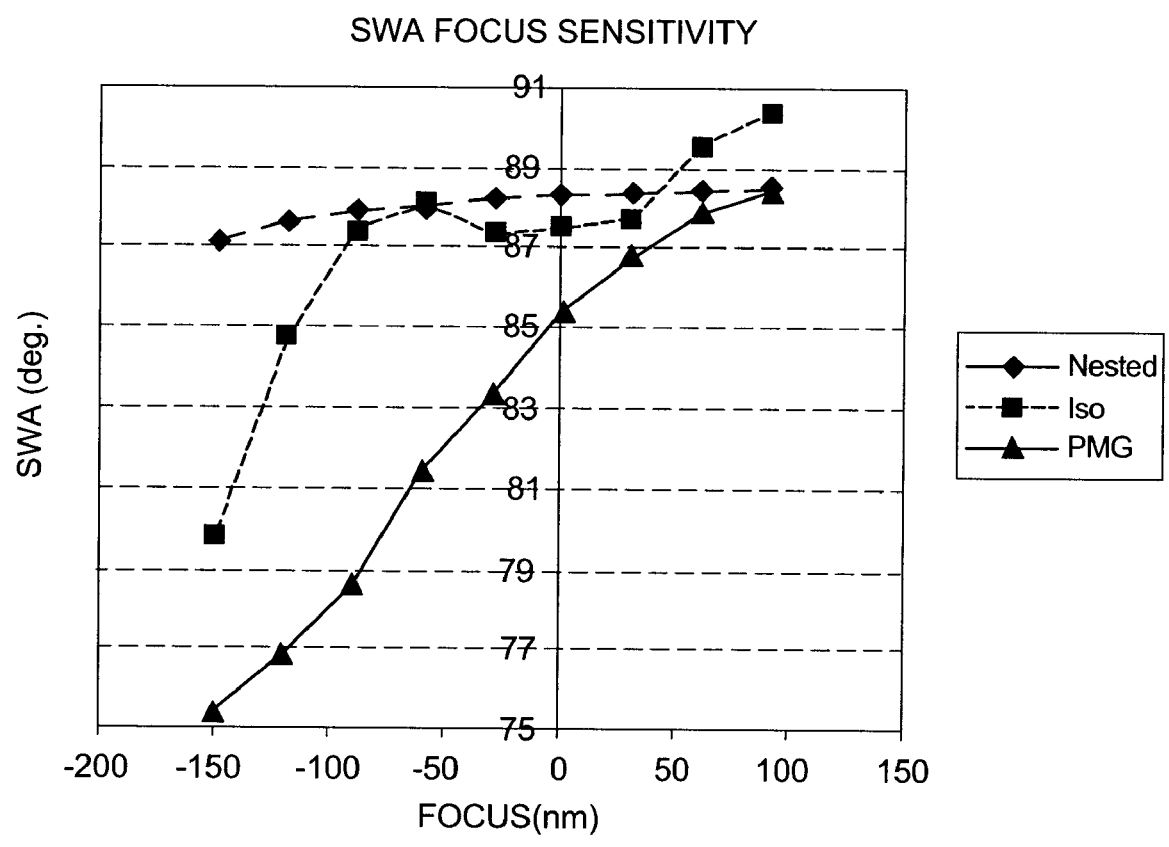
FIG. 12 is a graphical representation similar to that of FIG. 11, except comparing focus sensitivity.

The process monitor grating pattern of the present invention also shows improved dose and focus sensitivity over the prior art gratings when measuring sidewall angle (SWA) in degrees along an elevational cross section of an image printed through a resist film layer (FIGS. 7 and 8). FIG. 11 is a is a comparison of dose sensitivity of a measurement of sidewall angle of a printed image of a conventional prior art nested and isolated solid line grating compared to a process monitor grating pattern of the present invention. FIG. 12 compares the same prior art and present invention grating patterns for focus sensitivity in sidewall angle measurement. The present invention process monitor grating pattern displays a shallower sidewall angle at nominal dose and focus, which facilitates sidewall angle measurement in either optical scatterometry or SEM measurement. At the same time, the present invention process monitor grating pattern displays high, monotonic sidewall angle sensitivity to focus, which indicates an improved dose and focus deconvolution capability for lithographic system monitoring.

To monitor and optimize imaging and process parameter settings in a lithographic pattern imaging and processing system, the process monitor grating pattern of the present invention should be exposed and printed in a resist film layer under known conditions, and the relevant dimensions of the printed image, e.g., mid-CD dimension or sidewall angle, should be correlating to desired exposure dose and focus conditions. Once this is known, the same process monitor grating patterns are exposed and printed as control patterns on the resist film layers of subsequent wafers, and the corresponding locations on the exposed and printed image are measured. The image dimensions measured on the subsequent wafers are then compared with the correlated original image dimensions to determine if the exposure dose and focus of the lithographic system are operating within desired limits. If exposure dose or focus parameter has drifted and is no longer within process metrics, the appropriate correction may be made to the parameter. The process monitor grating pattern of the present invention may also be exposed and printed on different regions of the resist film layer on the same wafer, and then compared to determine any dose or focus process parameter variations across the wafer surface.

Figure 13:
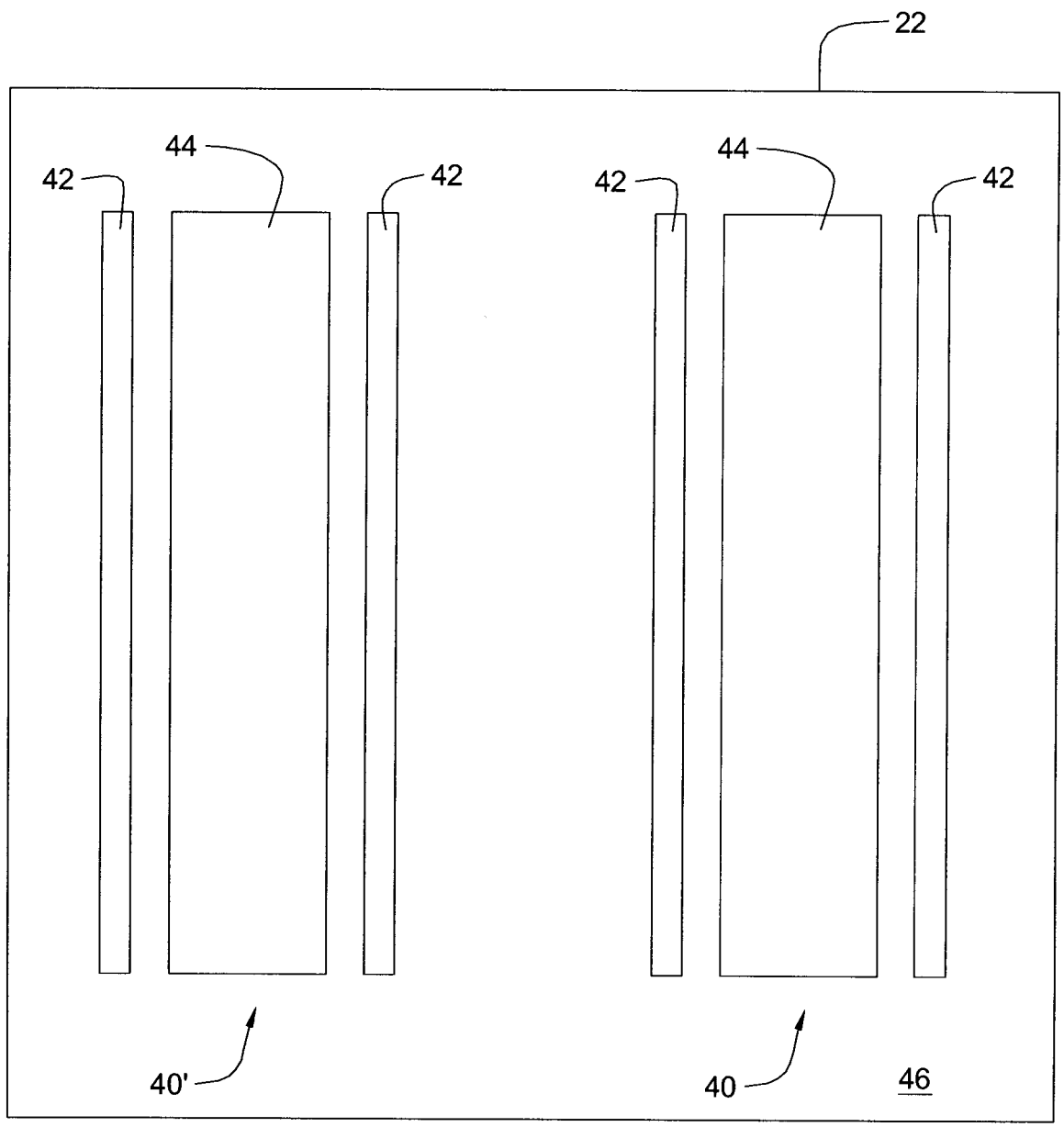
FIG. 13 is a top plan view of a pair of spaced process monitor grating patterns disposed on a photolithographic reticle in accordance with the present invention, which may be used in bright- or dark-field lithography.

Although the previous examples have been of the use of the process monitoring grating patterns in bright field lithography, they may be used in other types of lithography. As shown in FIG. 13, the line elements 42, 44 of the spaced process monitor grating patterns 40, 40' may be opaque lines deposited on a transparent substrate 46 of the reticle 22 for use in bright-field lithography. Alternatively, line elements 42, 44 may be transparent lines on an opaque substrate 46 of the reticle for dark-field lithography. The process monitor grating patterns 40, 40' may also be used for scanning electron microscope (SEM) or other types of lithographic measurement.

Figure 14:
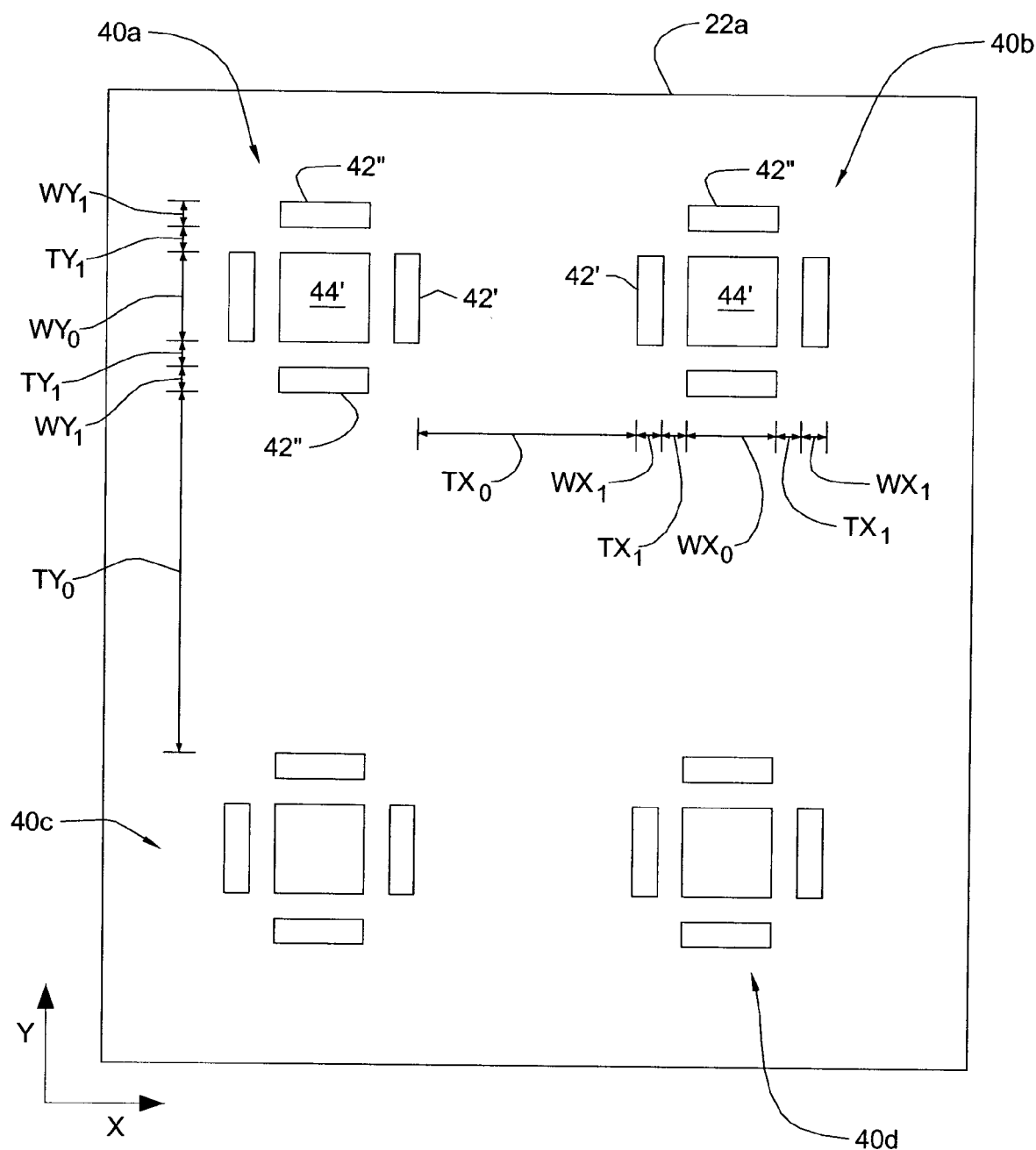
FIG. 14 is a top plan view of a two-dimensional process monitor grating pattern of the present invention disposed on a photolithographic reticle, the patterns being spaced in x- and y directions from one another, and each pattern containing line elements arrayed in both the x- and y directions.

Additionally, instead of having the line elements of the process monitor grating patterns arrayed in only one dimension, the process monitor grating patterns may be constructed to have both the patterns and line elements spaced in x- and y directions. FIG. 14 shows reticle 22a with process monitors 40a, 40b, 40c, 40d arrayed in both x- and y directions. Each process monitor grating pattern has a central element 44' that has an x-dimension $w_{x0}$ and a y-dimension $w_{y0}$. Spaced in the x-direction from central element 44' a distance $t_{x1}$ are adjacent elements 42' having width $w_{x1}$ in the x-direction. The length of element 42' in the y-direction is $w_{y0}$. Spaced in the y-direction from central element 44' a distance $t_{y1}$ are adjacent elements 42" having width $w_{y1}$ in the y-direction. The length of element 42" in the x-direction is $w_{x0}$. The dimension of the space between adjacent process monitor grating pattern is $t_{x0}$ in the x-direction and $t_{y0}$ in the y-direction. The pitch in the x-direction, $P_{PMGX}$, is therefore $W_{x1}+T_{x1}+W_{x0}+T_{x1}+W_{x1}+T_{x0}$, and the pitch in the y-direction, $P_{PMGY}$ is therefore $W_{y1}+T_{y1}+W_{y0}+T_{y1}+W_{y1}+T_{y0}$. The widths and spacings and pitches of the elements and process monitor grating patterns in the x- and y-directions may be the same or may be different, depending on the lithographic process conditions being monitored. Such two-dimensional structures are particularly applicable to the monitoring and control of contact or trench patterns.

In the case of the two-dimensional process monitor grating patterns as described above and shown in FIG. 14, such patterns may be used to monitor the dimensions and other process parameters of two-dimensional electrical contact elements to be formed by images developed in the resist layer, e.g., as openings in the resist (spaces) or as resist areas (shapes). Multiple ones of the process monitors 40a, 40b, 40c, 40d in FIG. 14, for example, may be arrayed in the x- and y-directions near and around contact images in the resist layer, or one or more of process monitors 40a, 40b, 40c, 40d may themselves be projected and developed with the desired dimensions to form the contact images. The process monitor grating patterns then may be used to monitor and control process conditions in both the critical x- and y-dimensions of the contact elements.

The applications of the present invention include across field wafer dose and or focus monitoring which may be set up for a dose mapper or set up for a CD optimizer. This can also be used as a flare monitor and for pattern density characterization.

Figure 15:
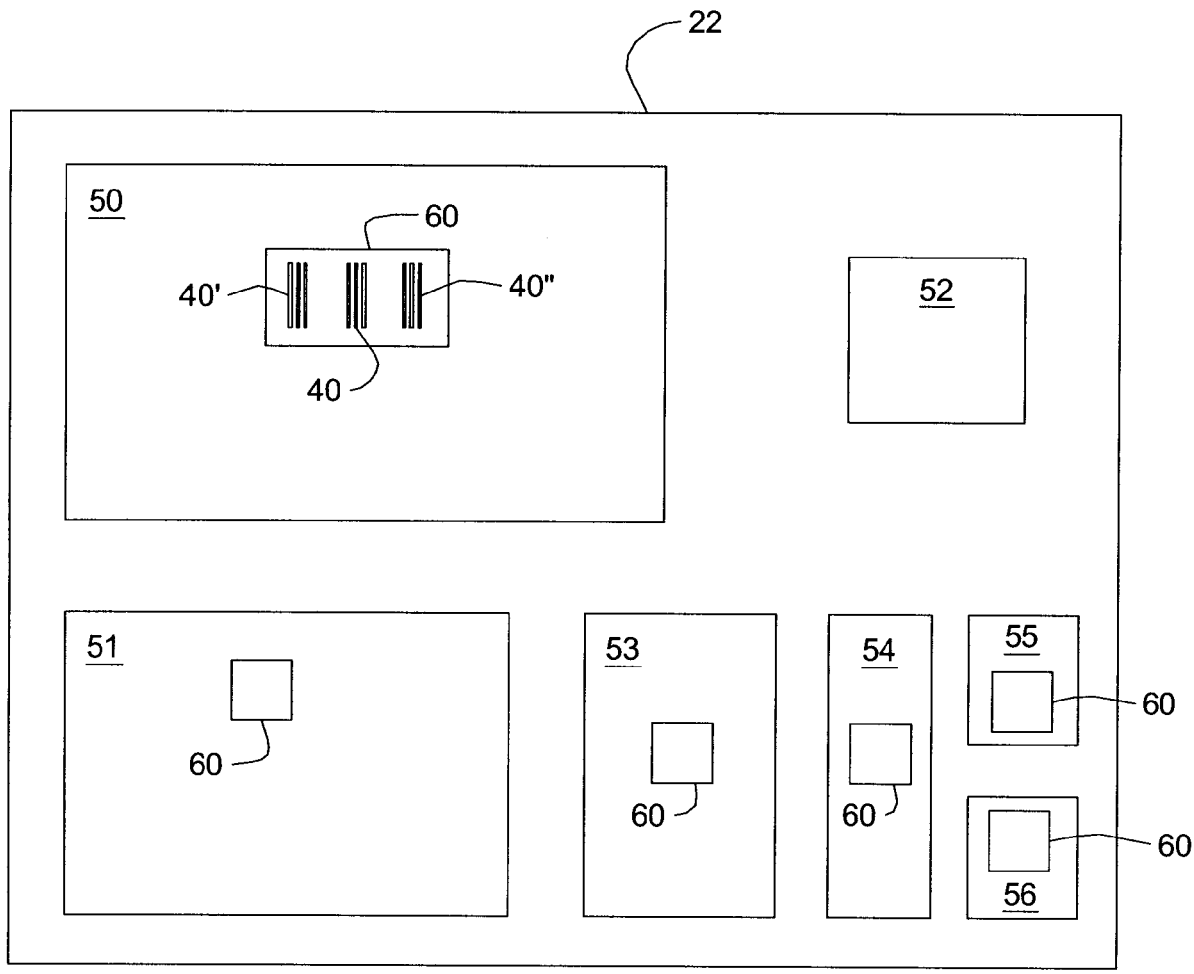
FIG. 15 is a top plan view of the process monitor grating pattern of the present invention embedded into different areas of circuit pattern density on a reticle used in a lithographic system.

A pattern density effect sensor is depicted in FIG. 15 which shows a reticle 22 that has printed thereon circuits or other microelectronic features 50, 51, 52, 53, 54, 55 and 56 of different pattern densities. Within each circuit pattern is embedded a process monitor grating pattern sensor 60 having the spaced patterns 40, 40', 40" as described above. This sensor 60 may be used to observe how various density and other environments on the circuit pattern affect the grating pattern. One may also test spatial range of density effect by measuring the center to edge of the grating pattern. The process monitor grating patterns are believed to have a greater sensitivity to proximity effects in lithographic printing.

The advantages of the present invention provide high sensitivity to both dose and or focus and easy measurement via optical scatterometry or SEM. The process monitor grating pattern features are robust, are readily fabricated with good uniformity across the mask, and are easier to build than prior art structures such as those suggested by Starikov. Furthermore, the structures suggested by Starikov are sensitive only to dose, whereas the inventive structure can be sensitive to both dose and focus. The process monitor grating pattern of the present invention can be printed measured over very a wide range of dose and focus values, and provides ease of measurement using either low resolution techniques, such as optical scatterometry or diffractometry, or high resolution techniques, such as SEM or AFM.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making a process monitor grating pattern for use on a mask to be used in a lithographic imaging system comprising:

determining minimum resolvable pitch of a plurality of spaced, adjacent line elements, wherein each of the line elements are separately resolvable when projected by the lithographic imaging system;

selecting a process monitor grating period $P_{PMG}$ that is an integer multiple M, greater than 1, of the minimum resolvable pitch, the process monitor grating period being determined by the formula:

$$P_{PMG} < [(M+1)/(1+\sigma_{max})]\lambda/NA$$

wherein $\lambda$ is the exposure wavelength, NA is the numerical aperture value, and $\sigma_{max}$ is the maximum illumination coherence of the lithographic imaging system; and designing a process monitor grating pattern having a plurality of adjacent sets of grouped line elements spaced from each other, each set of grouped line elements comprising a center line and adjacent lines spaced on each side of the center line, and wherein the center line has a width greater than the widths of the adjacent lines, the number of line elements in each set of grouped line elements in a process monitor grating pattern being the smallest odd integer greater than or equal to M, each set of grouped line elements being spaced from and parallel to an adjacent set of grouped line elements by the process monitor grating period, such that when the process monitor grating pattern is projected by the lithographic imaging system the line elements in each set are unresolvable from each other and Fourier coefficients of diffracted orders m created by the line elements in the range of $1 < |m| \leq M$ are zero, a solution set of the Fourier coefficients being selected to be compatible with the fabrication capability of the mask to be made and the wafer process, the designing of the grouped line elements including correcting widths of the line elements and spaces in the process monitor grating pattern for electromagnetic field (EMF) effects in the mask to be used in the lithographic imaging system.

2. The method of claim 1 further including depositing the process monitor grating on a mask to be used in the lithographic imaging system.

3. The method of claim 1 including sets of grouped line elements spaced apart in two dimensions, the process monitor grating period of the grouped line elements spaced apart in one dimension being the same or different from the process monitor grating period of the grouped line elements spaced apart in the other dimension.

4. A lithographic imaging system mask comprising a substrate having a process monitor grating pattern thereon, the process monitor grating pattern comprising a plurality of adjacent sets of grouped line elements spaced from each other, each set of grouped line elements comprising a center line and adjacent lines spaced on each side of the center line, each set of grouped line elements being spaced from and parallel to an adjacent set of grouped line elements by a process monitor grating period, the process monitor grating period being an integer multiple M, greater than 1, of the minimum resolvable pitch of spaced, adjacent line elements that are separately resolvable when projected by the lithographic imaging system, wherein when the process monitor grating pattern is projected by the lithographic imaging system the line elements in each set are unresolvable from each other and Fourier coefficients of diffracted orders m created by the line elements in the range of $1 < |m| M$ are zero.

5. The mask of claim 4 including sets of grouped line elements spaced apart in two dimensions, the process monitor grating period of the grouped line elements spaced apart in one dimension being the same or different from the process monitor grating period of the grouped line elements spaced apart in the other dimension.

6. A method of monitoring a lithographic imaging system comprising:

exposing and printing onto a resist film layer on a substrate, at different exposure dose or focus conditions, an image of a process monitor grating pattern comprising a plurality of adjacent sets of grouped line elements spaced from each other, each set of grouped line elements being spaced from and parallel to an adjacent set of grouped line elements by a process monitor grating period, the process monitor grating period being an integer multiple M, greater than 1, of the minimum resolvable pitch of spaced, adjacent line elements that are separately resolvable when projected by the lithographic imaging system, wherein when the process monitor grating pattern is projected by the lithographic imaging system the line elements in each set are unresolvable from each other and Fourier coefficients of diffracted orders m created by the line elements in the range of $1 < |m| \leq M$ are zero;

measuring a dimension of the exposed and printed image on the resist film layer at the different exposure conditions of the lithographic imaging system, the measured dimension comprising width of an image or sidewall angle of at least one set of the exposed and printed grouped line elements;

comparing the measured dimensions of the exposed image at the different exposure conditions and determining any differences in dimension; and using the comparison of the measured dimensions of the exposed image to determine desired exposure condition of the lithographic imaging system.

7. The method of claim 6 wherein the process monitor grating pattern comprises sets of grouped line elements spaced apart in x- and y-directions, the process monitor grating period of the grouped line elements spaced apart in one dimension being the same or different from the process monitor grating period of the grouped line elements spaced apart in the other dimension, and including measuring dimensions of the exposed and printed images in both x- and y-directions, comparing the measured dimensions in both x- and y-directions, and using the comparison of the measured dimensions to determine desired exposure conditions in both x- and y-directions, 8. The method of claim 7 wherein the measured dimensions in the x- and y-directions are used to monitor development of exposed images of contacts in the resist film layer.

9. A method of monitoring a lithographic imaging system comprising:

exposing and printing onto a resist film layer on a substrate, at different regions of the resist film layer, a process monitor grating pattern comprising a plurality of adjacent sets of grouped line elements spaced from each other, each set of grouped line elements being spaced from and parallel to an adjacent set of grouped line elements by a process monitor grating period, the process monitor grating period being an integer multiple M, greater than 1, of the minimum resolvable pitch of spaced, adjacent line elements that are separately resolvable when projected by the lithographic imaging system, wherein when the process monitor grating pattern is projected by the lithographic imaging system the line elements in each set are unresolvable from each other and Fourier coefficients of diffracted orders m created by the line elements in the range of $1 < |m| \leq M$ are zero;

measuring a dimension of the exposed and printed image on the resist film layer at the different regions, the measured dimension comprising width of an image or sidewall angle of at least one set of the exposed and printed grouped line elements;

comparing the measured dimensions of the exposed image at the different regions and determining any differences in dimension; and using the comparison of the measured dimensions of the exposed image to monitor exposure conditions at the different regions of the resist film layer, the exposure conditions comprising exposure dose or focus of the image by the lithographic imaging system.

10. The method of claim 9 further including exposing and printing onto a resist film layer circuit patterns of different pattern density on the different regions of the resist film layer, and wherein the comparison of the measured dimensions of the exposed image is used to determine lithographic conditions in different density environments on the circuit pattern.

* * * * *